United States Patent
Sun et al.

(10) Patent No.: US 11,605,764 B2
(45) Date of Patent: Mar. 14, 2023

(54) LED LIGHT SOURCE, SURFACE LIGHT SOURCE DISPLAY MODULE, AND PREPARATION METHOD FOR LED LIGHT SOURCE

(71) Applicant: DURA-CHIP (NANTONG) LIMITED, Nantong (CN)

(72) Inventors: Zhijiang Sun, Nantong (CN); Shuchang Wang, Nantong (CN); Shuai Chen, Nantong (CN)

(73) Assignee: DURA-CHIP (NANTONG) LIMITED, Nantong (CN)

( * ) Notice: Subject to any disclaimer, the term of this patent is extended or adjusted under 35 U.S.C. 154(b) by 0 days.

(21) Appl. No.: 17/166,159

(22) Filed: Feb. 3, 2021

(65) Prior Publication Data

US 2021/0210663 A1 Jul. 8, 2021

Related U.S. Application Data (63) Continuation of application No. PCT/CN2019/099069, filed on Aug. 2, 2019.

(30) Foreign Application Priority Data

| Aug. 3, 2018 | (CN) | 201810876013.3 |
| Sep. 14, 2018 | (CN) | 201811074813.X |
| Nov. 9, 2018 | (CN) | 201811330815.0 |

(51) Int. Cl.
*H01L 33/58* (2010.01)
*H01L 25/075* (2006.01)
(Continued)

(52) U.S. Cl.
CPC .......... *H01L 33/58* (2013.01); *H01L 25/0753* (2013.01); *H01L 27/156* (2013.01);
(Continued)

(58) Field of Classification Search
CPC .......... H01L 2933/0091; H01L 27/156; H01L 33/10; H01L 33/46; H01L 33/58;
(Continued)

(56) References Cited

U.S. PATENT DOCUMENTS

2005/0244993 A1* 11/2005 Bogner ................. H01L 33/501
438/22
2012/0026720 A1* 2/2012 Cho ....................... G02B 5/045
359/599

(Continued)

FOREIGN PATENT DOCUMENTS

| CN | 102496671 A | 6/2012 |
| CN | 103715340 A | 4/2014 |

(Continued)

OTHER PUBLICATIONS

International Search Report of PCT/CN2019/099069.

*Primary Examiner* — Feifei Yeung Lopez (57) ABSTRACT

The present disclosure provides an LED light source, a surface light source display module, and a preparation method for the LED light source. The LED light source includes: an LED chip including a first reflective layer, a P—GaN layer, a light-emitting layer, an N—GaN layer and a substrate, which are sequentially arranged from bottom to top; a light excitation layer configured for emitting light upon excitation with a blue light, wherein the LED chip is covered by the light excitation layer, that is, the light excitation layer is disposed on a top surface of the substrate of the LED chip and in contact with a side surface of the LED chip, wherein four side surfaces of the light excitation layer are defined as light output regions; and a second reflective layer disposed on a top surface of the light excitation layer, and a top surface of the second reflective (Continued)

layer is defined as a total reflection region or a partial reflection region. The light emission angle of the LED light source can be enlarged.

9 Claims, 8 Drawing Sheets

(51) Int. Cl.
| | |
|---|---|
| *H01L 33/32* | (2010.01) |
| *H01L 33/60* | (2010.01) |
| *H01L 27/15* | (2006.01) |
| *H01L 33/10* | (2010.01) |
| *H01L 33/46* | (2010.01) |
| *F21K 9/68* | (2016.01) |

(52) U.S. Cl.
CPC ............. *H01L 33/10* (2013.01); *H01L 33/32* (2013.01); *H01L 33/46* (2013.01); *H01L 33/60* (2013.01); *F21K 9/68* (2016.08); *H01L 2933/0058* (2013.01); *H01L 2933/0091* (2013.01)

(58) Field of Classification Search
CPC ..... H01L 33/60; H01L 33/32; H01L 25/0753; H01L 2933/0058; H01L 25/13; H01L 25/075; F21K 9/68
See application file for complete search history.

(56) References Cited

U.S. PATENT DOCUMENTS

| | | | |
|---|---|---|---|
| 2015/0338048 A1* | 11/2015 | Ahn | ..................... F21S 43/245 362/511 |
| 2015/0369997 A1 | 12/2015 | Ye et al. | |
| 2019/0285950 A1* | 9/2019 | Liu | ................... G02F 1/133606 |
| 2021/0262621 A1* | 8/2021 | Eom | ....................... F21S 43/16 |

FOREIGN PATENT DOCUMENTS

| | | |
|---|---|---|
| CN | 104006334 A | 8/2014 |
| CN | 106773315 A | 5/2017 |
| CN | 106932951 A | 7/2017 |
| CN | 110176448 A | 8/2019 |
| CN | 209325466 U | 8/2019 |
| CN | 209325530 U | 8/2019 |
| CN | 209325692 U | 8/2019 |

* cited by examiner

LED LIGHT SOURCE, SURFACE LIGHT SOURCE DISPLAY MODULE, AND PREPARATION METHOD FOR LED LIGHT SOURCE

CROSS-REFERENCE TO RELATED APPLICATIONS

This application is a continuation of PCT patent application PCT/CN2019/099069 filed on Aug. 2, 2019, which claims all benefits accruing from China Patent Application Nos. 201811074813.X, filed on Sep. 14, 2018, 201810876013.3, filed on Aug. 3, 2018, and 201811330815.0, filed on Nov. 9, 2018, in the China National Intellectual Property Administration, the content of which is hereby incorporated by reference.

TECHNICAL FIELD

The present disclosure relates to the field of light sources, and in particular, to an LED light source, a surface light source module, and a preparation method for an LED light source.

BACKGROUND

Currently, a conventional surface light source display module with direct-type mainly is prepared by the following three methods:

a first method of arranging a diffusion plate above an LED light source array with a certain distance;

a second method of attaching a lens adjacent to the LED light source; and a third method of mixing silica gel and phosphor and directly coating on the LED light source array to form a light guide dielectric layer. In the first method and the third method, the point light source can be changed to the surface light source. In the second method, light emitted from the LED light source can be transmitted to the diffusion plate through the lens and the air layer, and then the point light source can be changed to the surface light source.

At present, a light emitting angle of the LED light source is limited. For example, the light emitting angle of an LED light source only reaches up to 120 degrees. When a surface light source prepared by the first method or the second method is adopted, it is easy to form a dark region and there is a problem of poor uniformity of mixing the light. A thickness of the whole surface light source display module is great, which may be reduced only by reducing a distance between adjacent two LED light sources. However, this may make the number of LED light sources squared, increasing the cost greatly. When the surface light source prepared by the third method is adopted, although the thickness of the surface light source display module can be decreased, the light emitted from the LED light source is disadvantageously propagated in the phosphor layer due to the limitation of the light emitting angle of the LED light source, that is, the transverse propagation effect is limited.

SUMMARY

The present disclosure is to develop an LED light source with a larger light emitting angle, and a surface light source module capable of improving the light mixing effect, avoiding uneven brightness and reducing the overall thickness. The present disclosure is also to provide a preparation method of an LED light source.

The present disclosure provides an embodiment of an LED light source including an LED chip, a light excitation layer, and a second reflective layer. The LED chip includes a first reflective layer, a P—GaN layer, a light-emitting layer, an N—GaN layer and a substrate, which are sequentially arranged from bottom to top. The light excitation layer is configured for emitting light upon excitation with a blue light. The LED chip is covered by the light excitation layer, that is, the light excitation layer is disposed on a top surface of the substrate of the LED chip and in contact with a side surface of the LED chip. Four side surfaces of the light excitation layer are defined as a light output region. The second reflective layer is disposed on a top surface of the light excitation layer, and a top surface of the second reflective layer is defined as a total reflection or a partial reflection region.

The present disclosure further provides another embodiment of a surface light source module including a base, a plurality of LED light sources, and a transparent waveguide layer. The plurality of LED light sources are arranged at intervals on the base. The transparent waveguide layer is disposed on the base and covers the plurality of LED light sources. A thickness of the transparent waveguide layer is greater than or equal to a thickness of the plurality of LED light sources.

The present disclosure further provides another embodiment of a method for preparing an LED light source, including the following steps: S1, selecting a plurality of LED chips, wherein each of the plurality of LED chips comprises a first reflective layer, a P—GaN layer, a light-emitting layer, an N—GaN layer and a substrate, which are sequentially arranged from bottom to top; S2, equidistantly arranging the plurality of LED chips to form a first gap between two adjacent LED chips of the plurality of LED chips, disposing a light excitation layer on the plurality of LED chips and in the first gap, and baking to obtain a semi-finished product; S3, forming a second reflective layer on a top surface of the semi-finished product; and S4, baking and curing the semi-finished product having the second reflective layer, and then cutting and splitting the semi-finished product, and performing a chip test, sorting and rearrangement to obtain an LED light source.

The advantages of the LED light source of the present disclosure are as follows. In the LED light source, the first reflective layer is located on a bottom surface of the LED chip in the LED light source. The light excitation layer is disposed on the top surface of the substrate of the LED chip and in contact with the side surface of the LED chip. The second reflective layer is disposed on a top surface of the light excitation layer. On the one hand, two reflective layers (i.e. the first reflective layer and the second reflective layer) are disposed on both the bottom surface and a top surface of the LED light source, part of the light can be reflected to the side surface of the LED chip through the second reflective layer and the first reflective layer, thereby increasing the light emitting angle of the LED light source. On the other hand, since a wavelength of blue light is short, the blue light absorbs more severe in a conventional LED light source. The LED light source in the present disclosure includes a light excitation layer, and when the light emitted from the LED chip is continuously reflected between the second reflective layer and the first reflective layer, due to the presence of the light excitation layer, blue light of the reflected light may pass through the light excitation layer, resulting in further excitation, and the excited light is further mixed with the reflected light or emitting light to obtain a white light. Therefore, blue light absorption can be reduced while achieving a large angle of light emission. In addition, the LED light source in the present disclosure is independently assembled, and can be conveniently attached to or applied on various different substrates.

DETAILED DESCRIPTION

Figure 1:
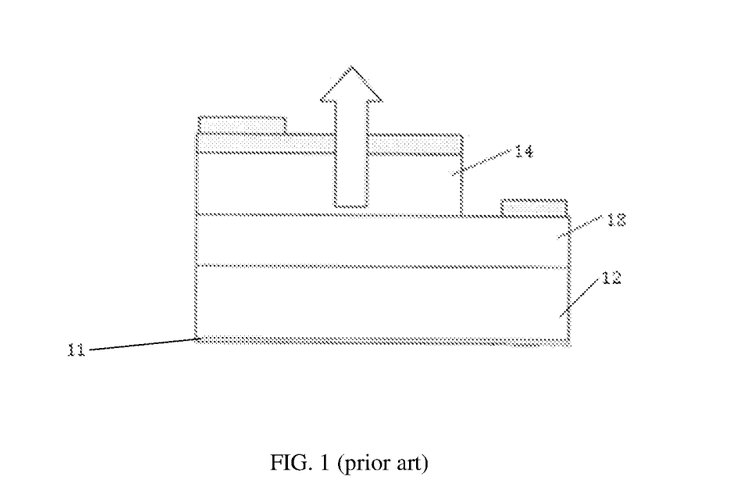
FIG. 1 is a schematic structural diagram of a conventional front-mounted LED chip with reflecting structure in prior art.
Figure 2:
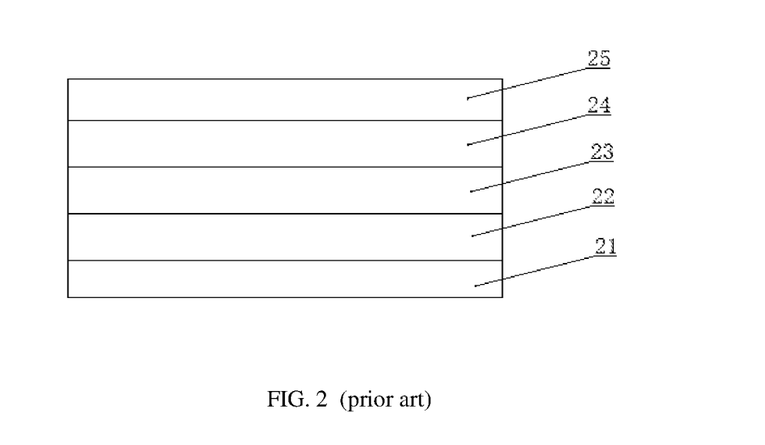
FIG. 2 is a schematic structural diagram of another conventional flip-mounted LED chip with reflecting structure in prior art.

Referring to FIG. 1 and FIG. 2, FIG. 1 is a schematic structural diagram of a conventional front-mounted LED chip with reflecting structure in prior art, and FIG. 2 is a schematic structural diagram of another conventional flip-mounted LED chip with reflecting structure in prior art. Referring to FIG. 1, the conventional front-mounted LED chip with a reflecting structure includes a reflective layer 11, a substrate 12, an N—GaN layer 13 and a P—GaN layer 14, which are sequentially arranged from bottom to top. Referring to FIG. 2, the conventional flip-mounted LED chip with reflecting structure includes a reflective layer 21, a P—GaN layer 22, a light-emitting layer 23, an N—GaN layer 24 and a substrate 25, which are sequentially arranged from bottom to top. Both the reflective layer of the front-mounted LED chip and the reflective layer of the flip-mounted LED chips are disposed on bottom surfaces of the LED chips, and light can be emitted from five surfaces of the LED chips.

At present, a light emitting angle of an LED light source formed by packaging the LED chips with reflecting structure is about 120 degrees, which limits application of the LED light source to the backlight display and lighting industry.

For example, a conventional surface light source display module with direct-type is prepared by the following three methods.

A first method is arranging a diffusion plate above an LED light source array at a certain distance, so that the point light source is changed to a surface light source by the diffusion plate.

A second method is attaching a lens adjacent to the LED light source, so that the light emitted from the LED light source is transmitted to the diffusion plate through the lens and the air layer, and then the point light source is changed into a surface light source.

A third method is mixing silica gel and phosphor and directly coating on the LED light source array to form a light guide dielectric layer, so that the point light source is changed to a surface light source There are some disadvantages or limitations in the above three methods.

Figure 3:
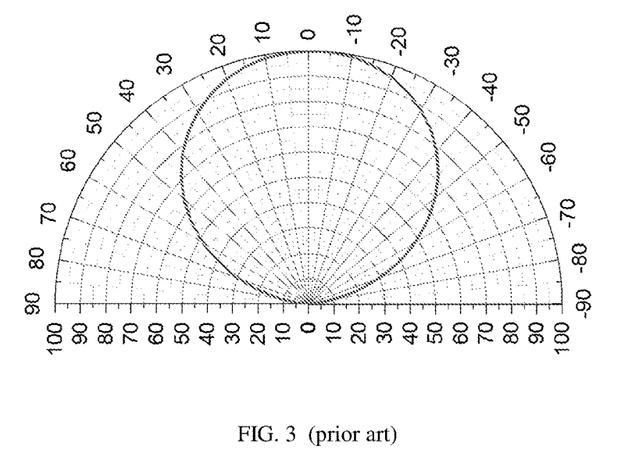
FIG. 3 is a test pattern of a light emitting angle of another conventional LED light source in prior art.
Figure 4:
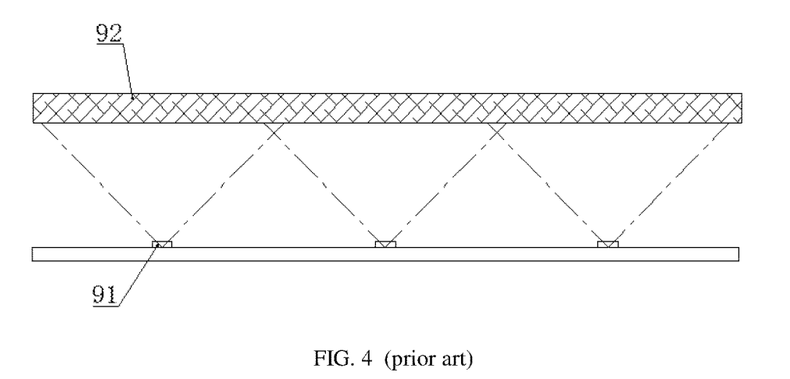
FIG. 4 is a schematic diagram illustrating light intensity superposition principle of another conventional direct-type surface light source display module prepared by a first method.

Specifically, disadvantages of the first method are as follows. Referring to FIG. 3 and FIG. 4, the light emitting angle of the conventional LED light source only reaches a maximum of 120 degrees. A distance between a LED light source 91 and a diffusion plate 92 should be large enough so as to achieve a relatively uniform light mixing effect, so a thickness of the whole surface light source display module is generally large, thereby limiting the whole surface light source display module to apply to the lighting industry, such as a panel lamp. Its application is very limited.

Figure 5:
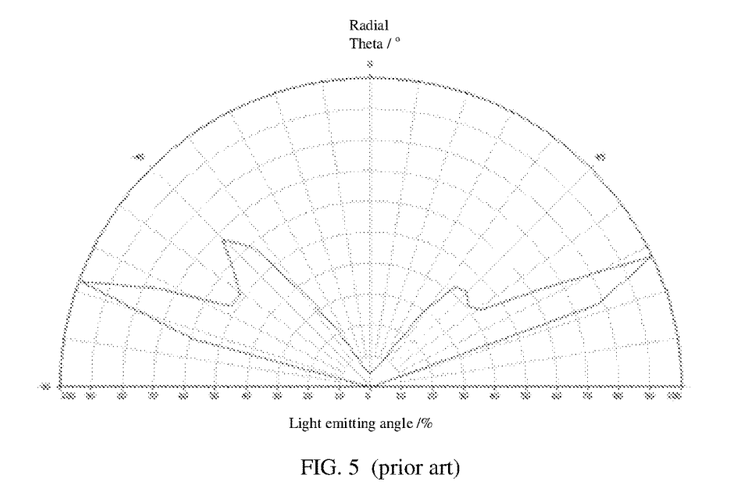
FIG. 5 is a diagram illustrating the light emitting angle of another conventional LED light source with addition of a lens in prior art.
Figure 6:
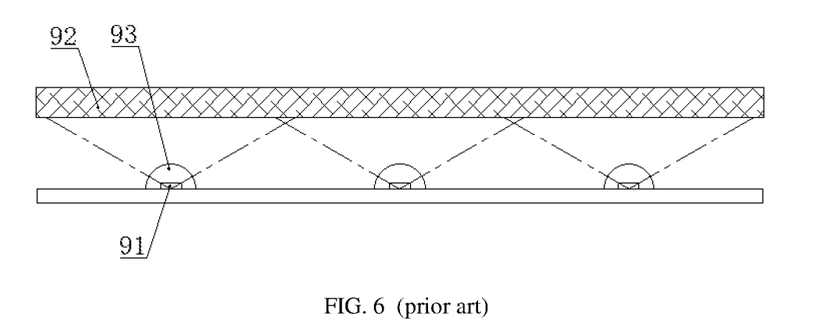
FIG. 6 is a schematic diagram illustrating light intensity superposition principle of another conventional direct-type surface light source display module having LED light source with addition of a lens in prior art.
Figure 7:
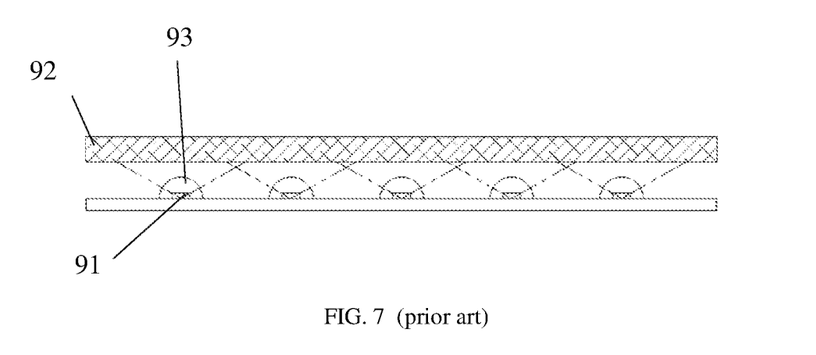
FIG. 7 is a schematic diagram illustrating a light intensity superposition principle of another conventional direct-type surface light source display module including closely arranging LED light sources and lens.

Disadvantages of the second method are as follows. Referring to FIG. 5 and FIG. 6, the light emitting angle of a conventional LED light source 91 added with the lens 93 can reach 135 degrees. Although the light emission angle is increased, the light emitting from a top surface of a diffusion plate 92 is greatly reduced. A relatively uniform light mixing effect can be achieved within a relatively shorter distance. Since the secondary optical lens needs to be used, the diffusion plate 92 and the lens 93 should be located with a certain distance. Compared with that of the whole surface light source display module in the first method, even if the LED light sources are closely arranged (as shown in FIG. 7), the thickness of the whole surface light source display module is slightly reduced, but it cannot achieve an ultrathin effect.

Figure 8:
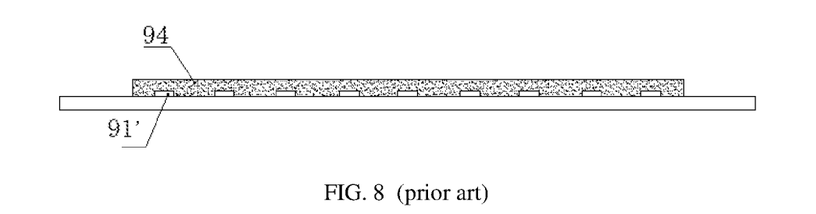
FIG. 8 is a schematic diagram illustrating light intensity superposition principle of another conventional direct-type surface light source display module including an LED light source array and a phosphor light guide dielectric layer.
Figure 9:
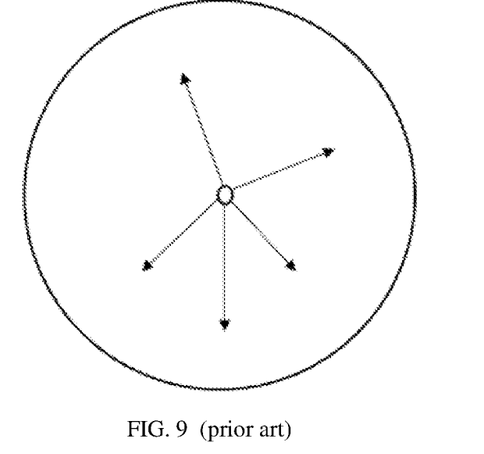
FIG. 9 is a schematic diagram illustrating loss of light intensity of a point light source including a phosphor light guide dielectric layer.
Figure 10:
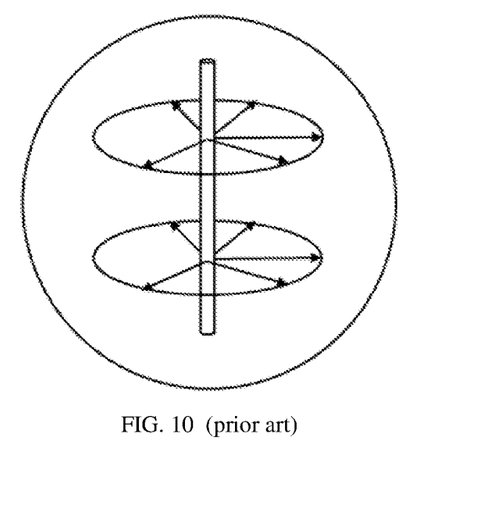
FIG. 10 is a schematic diagram illustrating loss of light intensity of a linear light source including a phosphor light guide dielectric layer.
Figure 11:
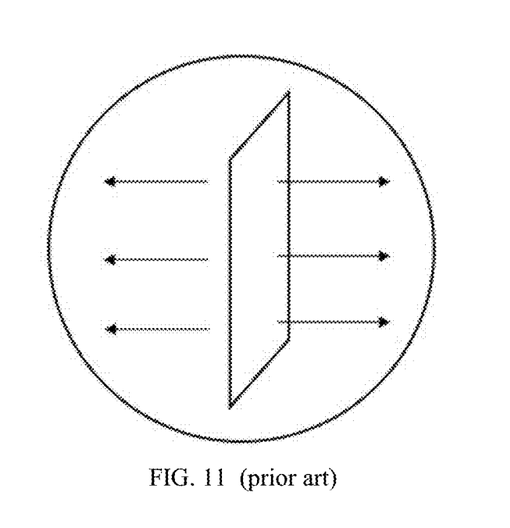
FIG. 11 is a schematic diagram illustrating loss of light intensity of a surface light source including a phosphor light guide dielectric layer.

Disadvantages of the third method are as follows. Referring to FIG. 8, a phosphor light guide dielectric layer 94 is coated on a surface of the light source array including the LED chips 91'. The lateral propagation and light mixing effect of white light may be slightly increased. However, it can be seen from optical theory that when a blue light is transmitted in the phosphor light guide dielectric layer, the intensity of the blue light as the excitation light is rapidly decreased due to absorption and irregular scattering of the phosphor. Referring to FIG. 9, when light of a point light source is transmitted in the phosphor light guide dielectric layer, the light intensity is numerically inversely proportional to the cube of the distance. As shown in FIG. 10, when light of a linear light source is transmitted in the phosphor light guide dielectric layer, the light intensity is numerically inversely proportional to the square of the distance. As shown in FIG. 11, when light of the surface light source is transmitted in the phosphor light guide dielectric layer, the light intensity is numerically inversely proportional to the distance.

In general, the light emitting angle of the LED light source is limited. For example, the light emitting angle of an LED light source only reaches up to 120 degrees. When a surface light source prepared by the first method or the second method is adopted, it is easy to form a dark region and there is a problem of poor uniformity of mixing the light. A thickness of the whole surface light source display module is great, which may be reduced only by reducing a distance between adjacent two LED light sources. However, this may make the number of LED light sources squared, increasing the cost greatly. When the surface light source prepared by the third method is adopted, although the thickness of the surface light source display module can be decreased, the light emitted from the LED light source is disadvantageously propagated in the phosphor layer due to the limitation of the light emitting angle of the LED light source, that is, the transverse propagation effect is limited. In addition, the white light obtained by mixing a light excited by a blue light is severely attenuated in the phosphor light guide dielectric layer during the propagation process, and the light intensity of the blue light is lowered, and the transverse propagation intensity along a waveguide direction is lowered. The light emitting brightness of the LED chip is non-uniform, and the light mixing effect is poor, resulting in the whole brightness of the surface light source being less uniform. Therefore, LED chips are disposed with a relatively high density, resulting in limiting LED chips to arrange with a larger distance.

In summary, it is urgent to develop an LED light source with a large light emitting angle, and a surface light source module capable of improving the light mixing effect and avoiding uneven brightness and reducing the overall thickness.

Figure 13:
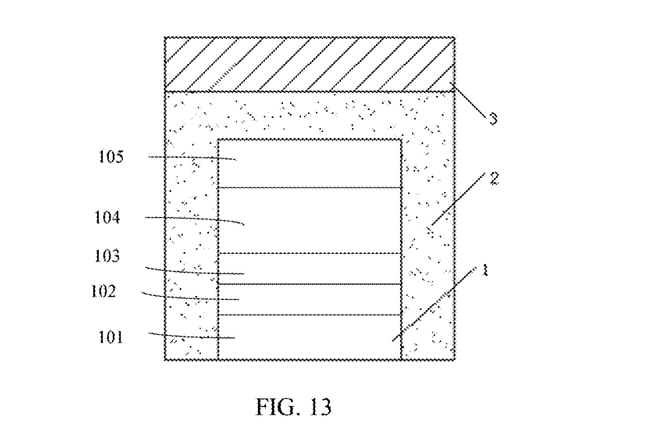
FIG. 13 is a schematic structural diagram of an LED light source in an embodiment of the present disclosure.

Referring to FIG. 13, FIG. 13 is a schematic structural diagram of an LED light source in an embodiment of the present disclosure. The LED light source includes:

an LED chip 1, wherein the LED chip 1 is a flip structure with a reflector, and the LED chip 1 includes a first reflective layer 101, a P—GaN layer 102, a light-emitting layer 103, an N—GaN layer 104 and a substrate 105 which are sequentially arranged from bottom to top;

a light excitation layer 2 configured for emitting light upon excitation with a blue light, wherein the LED chip 1 is covered by the light excitation layer 2; that is, the light excitation layer 2 is disposed on a top surface of the substrate 105 of the LED chip 1 and in contact with a side surface of the LED chip 1, wherein four side surfaces of the light excitation layer are defined as light output regions and the light excitation layer 2 may be a fluorescent powder layer;

a second reflective layer 3 disposed on a top surface of the light excitation layer 2, and a top surface of the second reflective layer 3 defined as a total reflection region or a partial reflection region.

In the preparation process, a thickness and transparency of the second reflective layer 3 can be controlled so as to adjust an amount of the light emitted from the side surface of the LED chip 1. In addition, in the present embodiment, the second reflective layer 3 can include particulate fillers configured for refracting and reflecting. The first reflective layer 101 and the second reflective layer 3 can be made of a translucent material. Furthermore, by controlling a thickness of first reflective layer 101 and the second reflective layer 3, it is helpful to increase the amount of light emitted from an edge (such as top or bottom) and the side surface of the LED chip 1.

Figure 14:
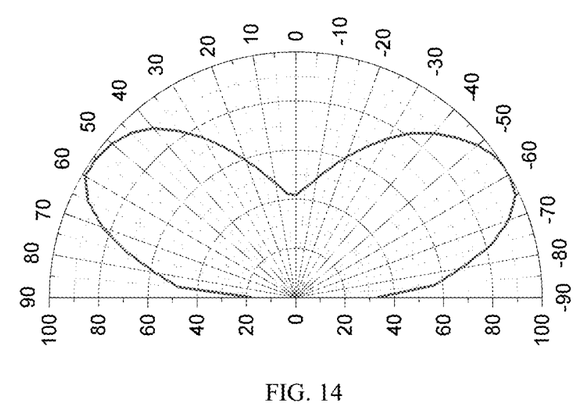
FIG. 14 is a test pattern of a light emitting angle of the LED light source of FIG. 13.

Taking an LED light source including the second reflective layer 3 made of a translucent and semi-reflective material and located on a top surface of the light excitation layer 2 as an example, as shown in FIG. 14, a main energy angle of a main light-emitting direction of the LED light source with a normal Lambertian light type structure can transition from 0 degree to positive and negative 30 degrees. Furthermore, it can be seen from the light intensity distribution that, the light-emitting light intensity is uniformly distributed throughout the light emission angle successfully, and the light-emitting light intensity of the LED light source in a range of positive and negative 85 degrees is about 64% of the light intensity peak. However, in the conventional LED light source with a normal Lambertian light type structure, if its light emission angle is 120 degrees, i.e. its light emission intensity in a range of positive and negative 60 degrees is only half of the light intensity peak (as shown in FIG. 3).

Figure 12:
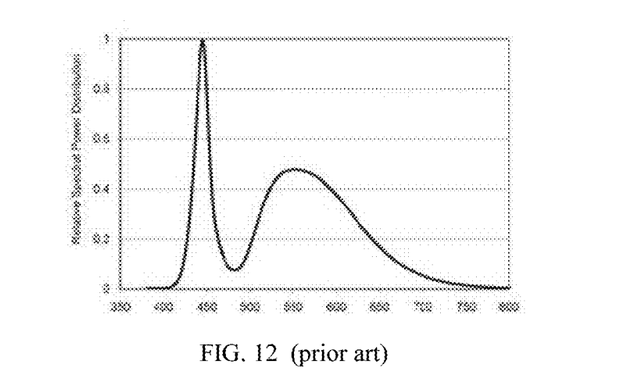
FIG. 12 is a fluorescence emission spectrum excited by blue LED.

In the LED light source of the present disclosure, the first reflective layer 101 is disposed on the bottom surface of the LED chip 1, the light excitation layer 2 is disposed on the side surface and the top surface of the LED chip 1, and the second reflective layer 3 is disposed on the top surface of the light excitation layer 2. On one hand, since the reflective layers (i.e. the second reflective layer 3 and the first reflective layer 101) are disposed on both top surface and bottom surface of the LED light source, part of the light can be reflected to the side surfaces of the LED chip 1 through the second reflective layer 3 and the first reflective layer 101, thereby increasing the light emitting angle of the LED light source. On the other hand, as shown in FIG. 12, in the fluorescence emission spectrum excited by the blue LED chip, the absorbance of light in a long wavelength band such as green light, yellow light, and red light in the LED chip is relatively low, while the blue light emitted by the LED chip itself is relatively short, the absorbance is the highest, i.e. the most severe. However, the LED light source in the present disclosure includes the light excitation layer 2, and when the light emitted from the LED chip 1 is continuously reflected between the second reflective layer 3 and the first reflective layer 101, due to the presence of the light excitation layer 2, blue light of the reflected light may pass through the light excitation layer 2, resulting in further excitation, and the excited light is further mixed with the reflected light or emitting light to obtain a white light. Therefore, blue light absorption can be reduced while achieving a large angle of light emitting. In addition, the LED light source in the present disclosure is independently assembled, and can be conveniently attached to or applied on various different substrates.

Figure 15:
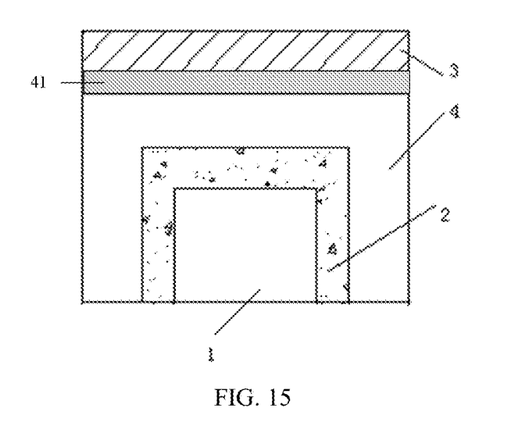
FIG. 15 is a schematic structural diagram of an LED light source in another embodiment of the present disclosure.

The present disclosure further provides another embodiment as shown in FIG. 15. FIG. 15 is a structural schematic diagram of an LED light source in another embodiment of the present disclosure. A difference between the LED light source in FIG. 15 and that in FIG. 13 is that FIG. 15 further includes a first transparent medium layer 4 between the light excitation layer 2 and the second reflective layer 3, wherein the light excitation layer 2 is covered by the first transparent dielectric layer 4, that is, the first transparent dielectric layer 4 is disposed on a top surface of the light excitation layer 2 and in contact with a side surface of the light excitation layer 2, the second reflective layer 3 is disposed on a top surface of the first transparent dielectric layer 4. Furthermore, in the present embodiment, the LED light source can further include a second transparent medium layer 41, which is located between the first transparent medium layer 4 and the second reflective layer 3. A refractive index of the first transparent dielectric layer 4 is greater than that of the second transparent dielectric layer 41. The arrangement of the first transparent medium layer 4 or the second transparent medium layer 41 can enlarge the light emitting angle of the LED chip 1, guide more light to a transparent waveguide layer, increase the light emitting angle thereof, and further improve the light mixing effect.

Figure 16:
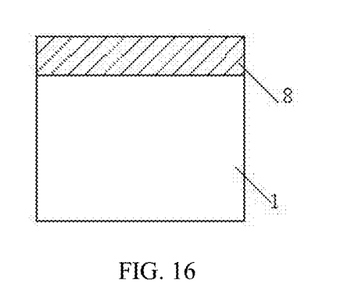
FIG. 16 is a schematic structural diagram of an LED light source in another embodiment of the present disclosure.

The present disclosure further provides another embodiment of an LED light source. The LED light source includes an LED chip 1 as shown in FIG. 16. FIG. 16 is a schematic structural diagram of an LED light source in another embodiment. A top surface of the LED chip 1 is provided with a third reflective layer 8, and the third reflective layer 8 is located between the substrate of the LED chip 1 and the light excitation layer 2, and the third reflective layer 8 is a partially light-emitting and partially reflective structure.

The present disclosure further provides a preparation method for the LED light source as described below.

In one embodiment, a preparation method for the LED light source as shown in FIG. 13 includes the following steps:

Step S1: selecting a plurality of LED chips 1, wherein each of the plurality of LED chips comprises a first reflective layer 101, a P—GaN layer 102, a light-emitting layer 103, an N—GaN layer 104 and a substrate 105, which are sequentially arranged from bottom to top;

Step S2: equidistantly arranging the plurality of LED chips 1 to form a first gap between adjacent two of the plurality of LED chips 1, disposing a light excitation layer 2 on the plurality of LED chips 1 and in the first gap, and baking to obtain a semi-finished product;

Step S3: forming a second reflective layer 3 on a top surface of the semi-finished product. Specifically, the second reflective layer 3 is a metal layer or a layer including particulate fillers configured for refraction and reflection on the top surface of the light excitation layer 2.

Step S4: curing the semi-finished product having the second reflective layer 3, and then cutting and splitting the semi-finished product, and performing a chip test, sorting and rearrangement to obtain an LED light source.

The method further includes a step of disposing a third reflective layer 8 on the top surface of the LED chip 1. The above step S1 further includes following sub-steps: selecting an LED wafer, wherein the LED wafer includes the first reflective layer 101, the P—GaN layer 102, the light-emitting layer 103, the N—GaN layer 104 and the substrate 105 disposed sequentially from bottom to top; detecting whether the LED wafer is qualified; disposing the third reflective layer 8 on a top surface of the substrate 105 of the LED wafer; and baking and curing the LED wafer having the third reflective layer 8, and then cutting and splitting the LED wafer to obtain the plurality of LED chips 1. The obtained LED chip 1 includes the first reflective layer 101, the P—GaN layer 102, the light-emitting layer 103, the N—GaN layer 104, the substrate 105 and the third reflective layer 8 which are sequentially disposed from bottom to top. Furthermore, the method further includes a step of selecting a qualified LED chip 1 having the third reflective layer 8. So, an upper surface and a lower surface of the LED chip 1 respectively have the third reflective layer 8 and the first reflective layer 101.

In another embodiment, a preparation method for the LED light source as shown in FIG. 15 includes the following steps:

Step S1: selecting a plurality of LED chips 1, wherein each of the plurality of LED chips comprises a first reflective layer 101, a P—GaN layer 102, a light-emitting layer 103, an N—GaN layer 104 and a substrate 105, which are sequentially arranged from bottom to top; Step S2: equidistantly arranging the plurality of LED chips 1 to form a first gap between adjacent two of the plurality of LED chips 1, disposing a light excitation layer 2 on the plurality of LED chips 1 and in the first gap, and baking to obtain a semi-finished product. And furthermore, cutting and splitting the semi-finished product to obtain a plurality of preforms; equidistantly arranging the plurality of preforms form a second gap between adjacent two of the plurality of preforms; and disposing a first transparent medium layer 4 on a surface of the plurality of preforms and in the second gap, and baking and curing to obtain the semi-finished product having the first transparent medium layer 4;

Step S3: forming a second reflective layer 3 on a top surface of the semi-finished product. Specifically, the second reflective layer 3 is a metal layer or a layer including particulate fillers configured for refraction and reflection on the top surface of the light excitation layer 2;

Step S4: curing the semi-finished product having the second reflective layer 3, and then cutting and splitting the semi-finished product, and performing a chip test, sorting and rearrangement to obtain an LED light source.

The method further includes a step of disposing a third reflective layer 8 on the top surface of the LED chip 1. The above step S1 further includes the following sub-steps: selecting an LED wafer, wherein the LED wafer includes the first reflective layer 101, the P—GaN layer 102, the light-emitting layer 103, the N—GaN layer 104 and the substrate 105 disposed sequentially from bottom to top; detecting whether the LED wafer is qualified; disposing the third reflective layer 8 on a top surface of the substrate 105 of the LED wafer; and baking and curing the LED wafer having the third reflective layer 8, and then cutting and splitting the LED wafer to obtain the plurality of LED chips 1. The obtained LED chip 1 includes the first reflective layer 101, the P—GaN layer 102, the light-emitting layer 103, the N—GaN layer 104, the substrate 105 and the third reflective layer 8 which are sequentially disposed from bottom to top. Furthermore, the method further includes a step of selecting a qualified LED chip 1 having the third reflective layer 8. The other steps are not changed.

When the LED light source further includes a second transparent medium layer 41, the above step S3 can be as follows: forming the second transparent medium layer 41 and the second reflective layer 3 sequentially on the top surface of the semi-finished product having the first transparent medium layer 4 and the light excitation layer 2. In this way, referring to FIG. 15, the second transparent medium layer 41 can be located between the first transparent medium layer 4 and the second reflective layer 3. The arrangement of the second transparent medium layer 41 can enlarge the light emitting angle of the LED chip 1, guide more light to a transparent waveguide layer, increase the light emitting angle thereof, and further improve the light mixing effect.

The LED light source can be applied in panel lamp. Parameters of the LED light source in FIG. 13 of the present disclosure and the conventional LED light source are tested, and the result is shown in Table 1 below.

TABLE 1

Examples of panel lamp (size is 600 mm * 600 mm)

| | Light-emitting region | Main energy angle of a main light-emitting direction | Light-emitting angel | Thickness of panel lamp | Distance between adjacent two LED light sources | Number of LED light sources |
|---|---|---|---|---|---|---|
| LED light source of FIG. 13 | 600 mm * 600 mm | +60°, −60° | 170° | 25 mm | 80 mm | 42 |
| A conventional LED light source with addition of a diffusion plate | 600 mm * 600 mm | 0° (straight up direction) | 120° | 25 mm | 10 mm | 3588 |
| A conventional LED light source with addition of a diffusion plate and a lens (sparse, FIG. 4) | 600 mm * 600 mm | +65°,−65° | 136° | 25 mm | 75 mm | 49 |

From Table 1 above, it can be seen that, under the premise that the light emitting regions have the same area and the panel lamps have the same thickness, the LED light source in the present embodiment has four light-emitting sides and a large light emission angle. The main light emission energy direction is shifted from a straight up direction to a side direction. Meanwhile, the light emission angle is up to 170 degrees or more. Compared with a panel lamp combined with a conventional LED light source and a diffusion plate, under the premise of ensuring the same light mixing effect, a distance between adjacent two LED light sources of FIG. 13 is effectively improved, substantially reducing the number of LED light sources. Furthermore, compared with a panel lamp combined with a conventional LED light source with a lens and a diffusion plate, not only the number of LED light sources of FIG. 13 is reduced, but also the cost of the lens is saved.

Figure 17:
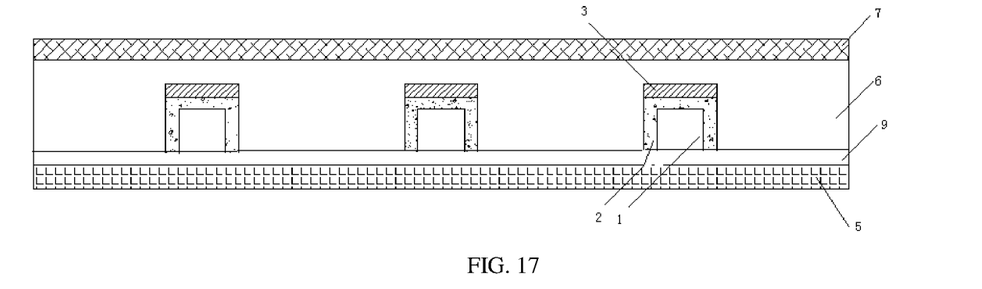
FIG. 17 is a schematic structural diagram of a surface light source module in an embodiment of the present disclosure.
Figure 18:
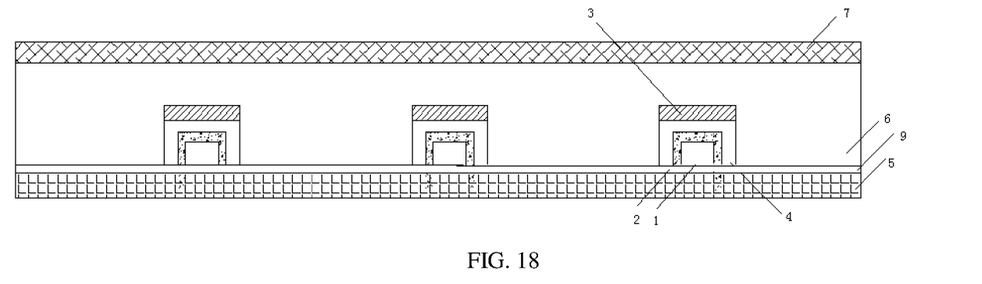
FIG. 18 is a schematic structural diagram of the surface light source module in another embodiment of the present disclosure.
Figure 19:
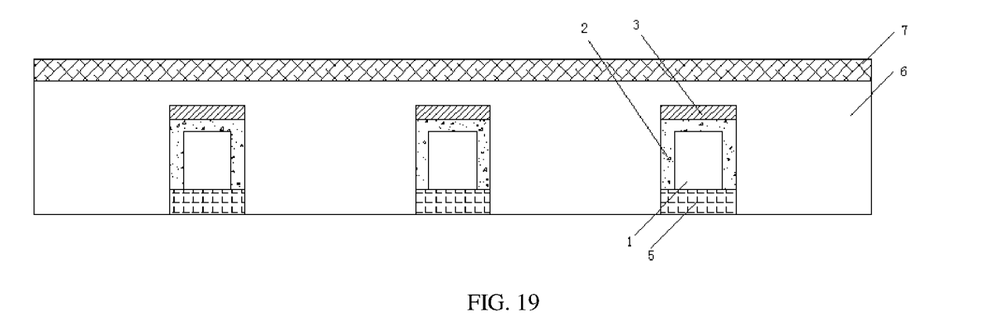
FIG. 19 is a schematic structural diagram of the surface light source module in another embodiment of the present disclosure.

Referring to FIG. 17 to FIG. 19, FIG. 17 is a schematic structural diagram of a surface light source module in an embodiment, FIG. 18 is a schematic structural diagram of the surface light source module in another embodiment, and FIG. 19 is a schematic structural diagram of the surface light source module in another embodiment. A surface light source module can include a base 5, a transparent waveguide layer 6 and an LED light source of the above embodiments. The base 5 can be a transparent or translucent flexible substrate, such as a PI board, a PET board, or a PEV board. Alternatively, the base 5 may also be a metal rigid plate, such as an aluminum plate, a thin copper plate, or a ceramic plate. A plurality of LED light sources can be arranged on a surface of the base 5. and the transparent waveguide layer 6 covers all the plurality of LED light sources, and a thickness of the transparent waveguide layer 6 is greater than or equal to a thickness of the plurality of LED light sources. In the present embodiment, the transparent waveguide layer 6 is a dielectric layer made of a homogeneous material and has a high refractive index.

In one embodiment, one surface of the transparent waveguide layer 6 away from the base 5 is defined as an upper waveguide interface, that is, the upper waveguide interface is a top surface of the transparent waveguide layer 6. The other surface of the transparent waveguide layer 6 close to the base 5 is defined as a lower waveguide interface, that is, the lower waveguide interface is a bottom surface of the transparent waveguide layer 6. A medium located on the upper waveguide interface away from the base 5 is defined as a first outer medium layer, i.e., the medium located above the top surface of the transparent waveguide layer 6 is a first outer medium layer. A refractive index of the transparent waveguide layer 6 is regarded as $n_2$ and a refractive index of the first outer medium layer is regarded as $n_{31}$. The refractive index $n_2$ of the transparent waveguide layer 6 is greater than the refractive index $n_{31}$ of the first outer medium layer.

Figure 20:
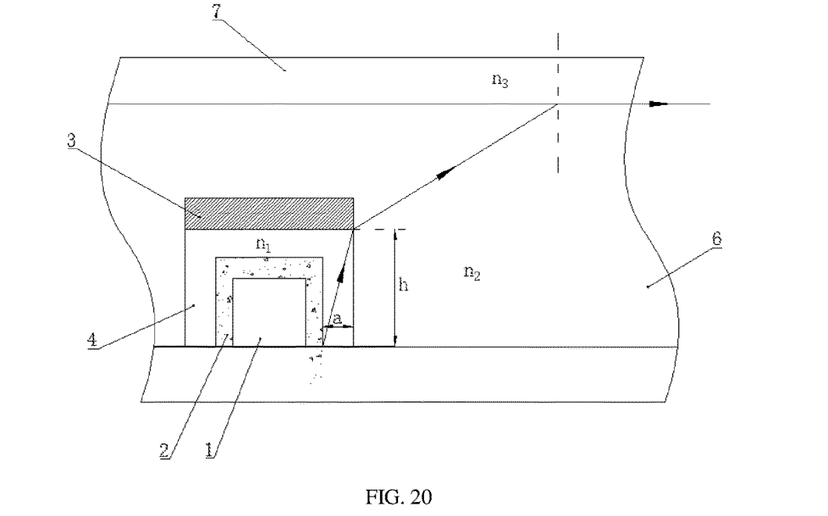
FIG. 20 is a partial enlarged view of the surface light source module of FIG. 18.

Optionally, when a surface light source module is manufactured by using an LED light source having the first transparent medium layer 4, as shown in FIG. 20, a size of a side of the first transparent medium layer 4 along a direction perpendicular to the thickness of the transparent waveguide layer 6 is defined as a, a size of the first transparent medium layer along a direction of the thickness of the transparent waveguide layer 6 is defined as h, a refractive index of the first transparent medium layer is defined as $n_1$. In order to achieve total reflection of light, the refractive index $n_1$ of the first transparent medium layer, the refractive index $n_2$ of the transparent waveguide layer, and the refractive index $n_{31}$ of the first outer medium layer satisfy the following formula:

$$\frac{h}{a} < \tan\left(\arcSin\frac{\sqrt{n_2^2 - n_{31}^2}}{n_1}\right).$$

In another embodiment, the base 5 is a transparent or translucent substrate. A refractive index of the base is defined as $n_4$, the base and the transparent waveguide layer together form a composite waveguide layer. The refractive index $n_2$ of the transparent waveguide layer 6 and the refractive index $n_4$ of the base satisfy the following formula: $|n_4-n_2|\leq 0.2$. The refractive index $n_4$ of the base is smaller than or equal to the refractive index $n_1$ of the first outer medium layer. An upper surface of the composite waveguide layer is defined as an upper waveguide interface. A lower surface of the composite waveguide layer is defined as a lower waveguide interface. A medium located on the upper waveguide interface is defined as a first outer medium layer. A medium located below the upper waveguide interface is defined as a second outer medium layer. A refractive index of the second outer medium layer is defined as $n_{32}$. The refractive index $n_2$ of the transparent waveguide layer 6 is greater than the refractive index $n_{31}$ of the first outer medium layer. The refractive index $n_4$ of the base 5 is greater than the refractive index $n_{31}$ of the first outer medium layer. The refractive index $n_2$ of the transparent waveguide layer is greater than the refractive index $n_{32}$ of the second outer medium layer. The refractive index $n_4$ of the base is greater than the refractive index $n_{32}$ of the second outer medium layer.

In another embodiment, referring to FIG. 17 to FIG. 19, a surface light source module further includes: a diffusion layer 7 located on a side of the transparent waveguide layer 6 away from the base 5, and an air gap is existed between the diffusion layer 7 and the transparent waveguide layer 6, wherein the air gap forms or is defined as the first outer medium layer. In application, the lower surface of the diffusion layer 7 can be uneven and have a plurality of microstructures. A ratio of an area of the plurality of microstructures to an area of the surface of the diffusion layer 7 is in a range of 10% to 100%. The plurality of microstructures of the diffusion layer 7 is in close contact with the upper waveguide interface of the transparent waveguide layer 6 to form the air gap.

Alternatively, the diffusion layer 7 can be located on a side of the base 5 away from the transparent waveguide layer 6, and an air gap is existed between the diffusion layer 7 and the base 5, wherein the air gap forms or is defined as the second outer medium layer. In application, a surface of the diffusion layer 7 close to the base 5 can be uneven and have a plurality of microstructures. A ratio of an area of the plurality of microstructures to an area of the surface of the diffusion layer 7 is in a range of 10% to 100%. The plurality of microstructures of the diffusion layer 7 is in close contact with the base 5 to form the air gap.

In the above embodiments, an air gap can be formed by plurality of microstructures on the lower surface of the diffusion layer 7, and a gap occupying a majority area of the diffusion layer 7 can be used as a low refractive index layer, so that white light emitted from the LED light source can form a waveguide or transmit in the transparent waveguide layer 6, so that the point light source can be changed to the surface light source, thereby increasing lateral propagation of white light.

Figure 21:
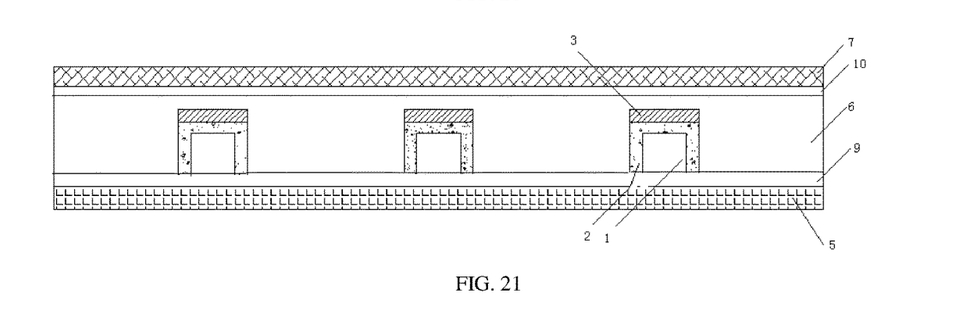
FIG. 21 is a schematic structural diagram of the surface light source module in another embodiment of the present disclosure.
Figure 22:
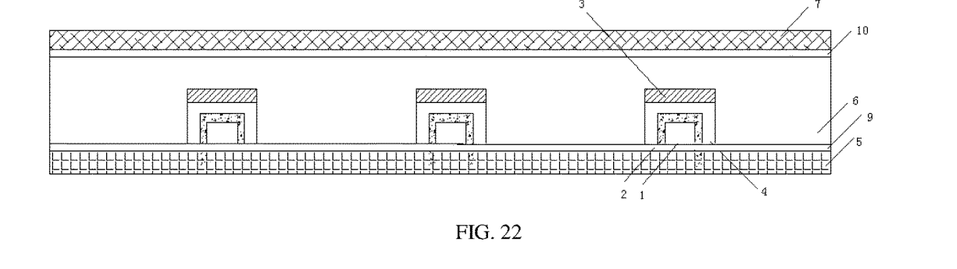
FIG. 22 is a schematic structural diagram of the surface light source module in another embodiment of the present disclosure.

In addition, as shown in FIG. 21 and FIG. 22, an air gap existing between the diffusion layer 7 and the transparent waveguide layer 6 may be regarded as the air layer 10. Alternatively, an air gap existing between the diffusion layer 7 and the base 5 may also be regarded as the air layer 10. The air layer 10 and the air gap may have the same purpose/effect.

In another embodiment, in order to improve the light intensity unevenness and improving the light mixing effect, a local scattering microstructure may further be located between the base 5 and the transparent waveguide layer 6, and/or, between the transparent waveguide layer 6 and the diffusion layer 7, and/or, between the base 5 and the diffusion layer 7. The local scattering microstructure region is generally provided with a dark region of an LED light source distributed in an array. The local scattering microstructure can be diffusion particles with a spherical shape. The function of diffusion particles is similar to that of a microlens. The local scattering microstructure can include holographic, cylindrical lenses, microlens arrays, and stretchable diffraction gratings. The diffusion particles can be prepared on a surface of the diffusion layer 7 by an extrusion roll embossing method, a diffusion lithography method, a hot embossing method, a self-assembly method, and an isotropic etching method. The light can be focused and rescattered within a certain emission angle when passing through the diffusion particles, and has a function of enhancing the brightness of the emitted light. In addition, the diameter of the diffusion particles and a difference between a refractive index of the diffusion particles and that of film-forming resin also ensures that the light will be not directly emitted from the diffusion film, achieving a uniform light mixing effect and uniform brightness. The local scattering microstructure can modulate an optical state of incident light by refracting light with a surface cycle or a randomly distributed microstructure. The surface light source module including diffusion film having the local scattering microstructure has advantages such as wide viewing angle, high transmittance, uniform light mixing, etc.

In another embodiment, referring to FIG. 17, FIG. 18, FIG. 21 and FIG. 22, the surface light source display module in the present disclosure can further include a waveguide reflecting layer 9 disposed between the transparent waveguide layer 6 and the base 5.

In another embodiment, as shown in FIG. 19, the base 5 can be a plurality of strip shaped substrates arranged discontinuously and at intervals, and the plurality of LED light sources are correspondingly arranged on the plurality of strip shaped substrates, that is, the plurality LED light source may correspond to the plurality strip shaped substrates, respectively.

When applied in a surface light source module, the base 5 can be a plurality of non-continuous strip shaped substrates arranged at intervals. The preparation method of the surface light source module can be as follows:

(1) selecting a continuous base, and integrally solidifying the LED light source, i. e. mounting an LED light source on the base, and then cutting to form a strip shaped base 5 with a width in a range of 0.2 mm to 3 mm, wherein one end or both ends of each strip-shaped base 5 being connected by an electrode plate or an electrode device to form an integral structure;

(2) disposing the integral structure of step (1) on a reusable mold or backlight panel, and then coating the whole mold/backlight panel with a high refractive transparent material (such as silica gel or acrylic material), so that the high refractive transparent material covers the whole surface of the strip shaped substrate and the area between adjacent strip shaped substrates, and finally molding to form a transparent waveguide layer 6 covering the LED light source;

(3) disposing a diffusion layer 7 on an upper surface of the transparent waveguide layer 6 to form a backlight module, and finally peeling off the backlight module from the mold/backlight panel.

The obtained product of the present embodiment can be applied in an ultrathin display, a panel lamp (with frame and without frame), a bulb lamp, a filament lamp, a daylight lamp, and a street lamp.

The LED light source can be applied in surface light source module, such as 6-inch mobile phone backlight. Parameters of the surface light source module including LED light source in FIG. 13 of the present disclosure and the conventional direct-light type backlight module are tested, and the result is shown in Table 2 below.

TABLE 2

| | | | | | | |
|---|---|---|---|---|---|---|
| | 6-inch mobile phone backlight application | | | | | |
| | Light-emitting region | Main energy angle of a main light-emitting direction | Light-emitting angel | Thickness of surface light source module | Distance between adjacent two LED light sources | Number of LED light sources |
| Surface light source module including LED light source of FIG. 13 (having the light excitation layer and without first transparent dielectric layer) | 132.48 mm * 74.52 mm | +60°, −60° | 170° | 1 mm | 6 mm | 241 |
| COB (FIG. 6) | 132.48 mm * 74.52 mm | 0° (straight up direction) | ~120° | 1 mm | 2 mm | 2416 |

It can be seen from Table 2 that, under the premise that the light emitting regions have the same area and the backlight modules have the same thickness, the LED light source in the present embodiment has four light-emitting sides and a large light emission angle. The main light emission energy direction is shifted from a straight up direction to a side direction. Meanwhile, the light emission angle is up to 170 degrees or more. Meanwhile, under the premise of ensuring the same light mixing effect, a distance between adjacent two LED light sources of FIG. 13 is effectively improved, substantially reducing the number of LED light sources.

The surface light source module provided in the present disclosure can be applied to the field of backlighting. In the structure of the surface light source module, white light emitted from an LED light source can form a waveguide in the transparent waveguide layer 6, so that the point light source can be changed to the surface light source, increasing the transverse propagation of white light and effectively improving the light mixing effect. The surface light source module can be applied in the field of high-performance display backlighting. Meanwhile, the transparent waveguide layer 6 with a specially designed structure also facilitates a uniform distribution of white light on the transparent or translucent base 5 and the emission of white light. The surface light source module of the above embodiment is further suitable for application in the field of electronic lighting paper.

The basic principles and main features of the invention and the advantages of the invention are shown and described above. It should be understood by those skilled in the art that the present invention is not limited to the above embodiments, and the above embodiments and description merely describe the principle of the present invention, and various changes and improvements will be made in the present invention without departing from the spirit and scope of the present invention, and these changes and improvements belong to the scope of the claimed invention. The scope of protection of the present invention is defined by the appended claims and their equivalents.

We claim:

1. A surface light source module, comprising:
   a base;
   a plurality of LED light sources, wherein the plurality of LED light sources are arranged at intervals on the base;
   a transparent waveguide layer disposed on the base and covering the plurality of LED light sources, wherein a thickness of the transparent waveguide layer is greater than or equal to a thickness of the plurality of LED light sources,
   a diffusion layer, wherein the diffusion layer is located on a surface of the transparent waveguide layer away from the base, and an air layer or an air gap is formed between the diffusion layer and the transparent waveguide layer; and/or, the diffusion layer is located on a surface of the base away from the transparent waveguide layer, and an air layer or an air gap is formed between the diffusion layer and the base,
   wherein each of the plurality of LED light sources comprises:
   an LED chip, comprising a first reflective layer, a P—GaN layer, a light-emitting layer, an N—GaN layer and a substrate, which are sequentially arranged from bottom to top;
   a light excitation layer configured for emitting white light upon excitation with a blue light, wherein the LED chip is covered by the light excitation layer, that is, the light excitation layer is disposed on a top surface of the substrate of the LED chip and in contact with a side surface of the LED chip, wherein four side surfaces of the light excitation layer are defined as light output regions; and
   a second reflective layer disposed on a top surface of the light excitation layer, and a top surface of the second reflective layer is defined as a total reflection or a partial reflection region,
   when the air layer or the air gap is formed between the diffusion layer and the transparent waveguide layer, a surface of the diffusion layer close to the transparent waveguide layer is uneven and has a plurality of microstructures, the plurality of microstructures of the diffusion layer is in close contact with the transparent waveguide layer to form the air gap, and a ratio of an area of the plurality of microstructures to an area of the surface of the diffusion layer is in a range of 10% to 100%; and/or when the air layer or the air gap is formed between the diffusion layer and the base, a surface of the diffusion layer close to the base is uneven and has a plurality of microstructures, the plurality of microstructures of the diffusion layer is in close contact with the base to form the air gap, and a ratio of an area of the plurality of microstructures to an area of the surface of the diffusion layer is in a range of 10% to 100%.

2. The surface light source module of claim 1, further comprising a local scattering microstructure, wherein the local scattering microstructure is located between the base and the transparent waveguide layer, and/or between the transparent waveguide layer and the diffusion layer, and/or between the base and the diffusion layer.

3. The surface light source module of claim 1, wherein when the air layer or the air gap is formed between the diffusion layer and the transparent waveguide layer, the air layer or the air gap is defined as a first outer medium layer, wherein a refractive index of the transparent waveguide layer is defined as $n_2$, a refractive index of the first outer medium layer is defined as $n_{31}$, and the refractive index $n_2$ of the transparent waveguide layer is greater than the refractive index $n_{31}$ of the first outer medium layer.

4. The surface light source module of claim 3, wherein each of the plurality of LED light sources comprises a first transparent medium layer, wherein the light excitation layer is covered by a first transparent dielectric layer, that is, the first transparent dielectric layer is disposed on a top surface of the light excitation layer and in contact with a side surface of the light excitation layer, a size of a side of the first transparent medium layer along a direction perpendicular to the thickness of the transparent waveguide layer is defined as a, a size of the first transparent medium layer along a direction of the thickness of the transparent waveguide layer is defined as h, a refractive index of the first transparent medium layer is defined as $n_1$, and the refractive index $n_1$ of the first transparent medium layer, the refractive index $n_2$ of the transparent waveguide layer, and the refractive index $n_{31}$ of the first outer medium layer satisfy the following formula:

$$\frac{h}{a} < \tan\left(\arcSin\frac{\sqrt{n_2^2 - n_{31}^2}}{n_1}\right).$$

5. The surface light source module of claim 3, wherein the base is a transparent or translucent base, a refractive index of the base is defined as $n_4$, the base and the transparent waveguide layer together form a composite waveguide layer, the refractive index $n_2$ of the transparent waveguide layer and the refractive index $n_4$ of the base satisfy the following formula:

$|n_4 - n_2| \leq 0.2$, and the refractive index $n_4$ of the base is smaller than or equal to the refractive index $n_{31}$ of the first outer medium layer.

6. The surface light source module of claim 5, wherein when the air layer or the air gap is formed between the diffusion layer and the base, the air layer or the air gap is defined as a second outer medium layer, a refractive index of the second outer medium layer is defined as $n_{32}$, the refractive index $n_4$ of the base is greater than the refractive index $n_{32}$ of the second outer medium layer, and the refractive index $n_2$ of the transparent waveguide layer is greater than the refractive index $n_{32}$ of the second outer medium layer.

7. The surface light source module of claim 1, wherein the transparent waveguide layer is a dielectric layer made of a homogeneous material.

8. The surface light source module of claim 1, further comprising:

a waveguide reflecting layer disposed between the transparent waveguide layer and the base.

9. The surface light source module of claim 1, wherein the base is a plurality of strip shaped substrates arranged discontinuously and at intervals, and the plurality of LED light sources are correspondingly arranged on the plurality of strip shaped substrates.

* * * * *